Sept. 4, 1956 E. A. STROMMEN 2,761,918
AMPLIFIER WITH GAIN CONTROL AND POWER CONTROL
Filed Nov. 19, 1952
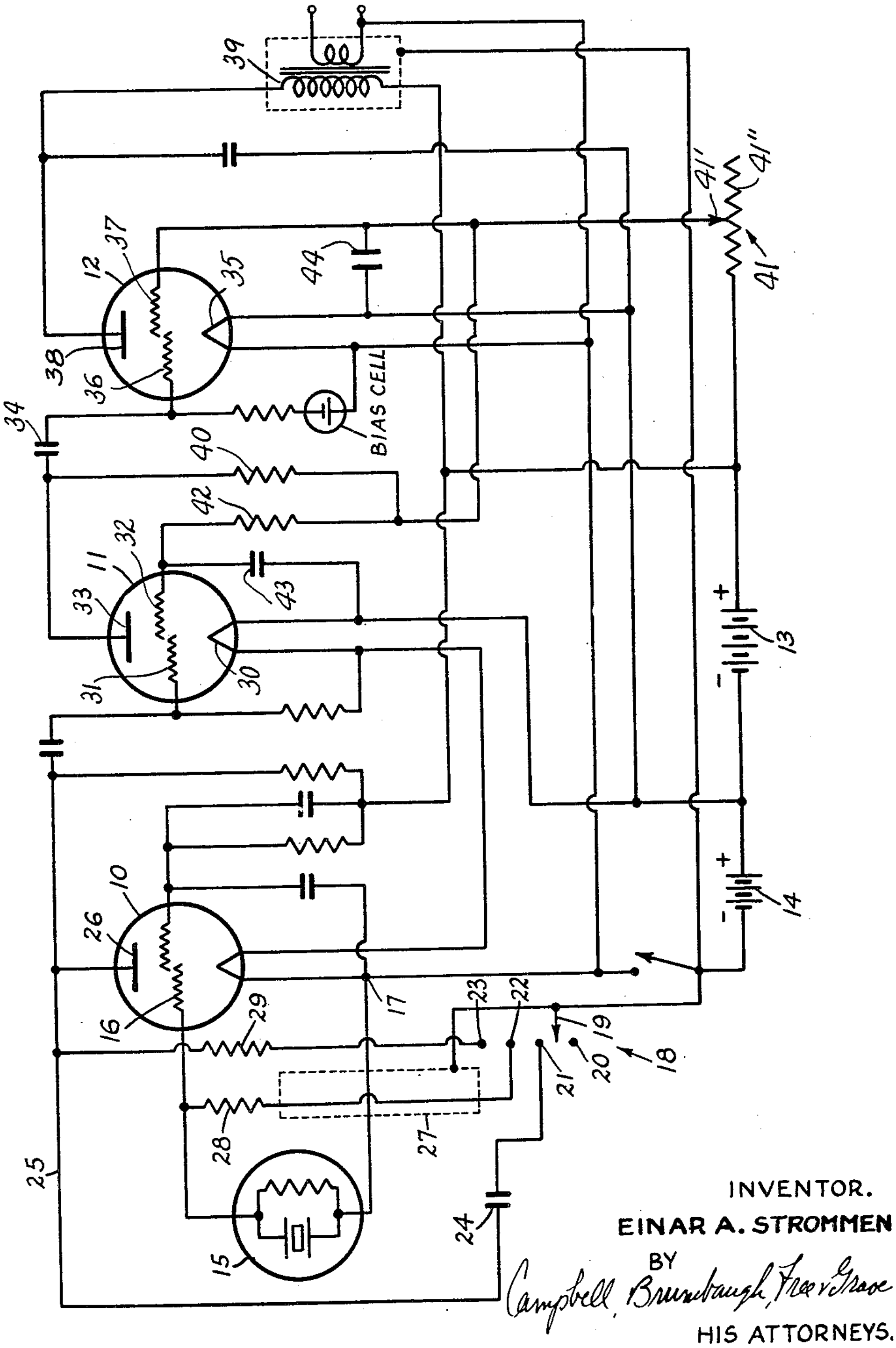
INVENTOR.
EINAR A. STROMMEN
BY
Campbell, Brumbaugh, Free & Graves
HIS ATTORNEYS.

United States Patent Office 2,761,918

Patented Sept. 4, 1956

2,761,918

AMPLIFIER WITH GAIN CONTROL AND POWER CONTROL

Einar A. Strommen, Merrick, N. Y., assignor to Dictograph Products Company, Inc., New York, N. Y., a corporation of Delaware Application November 19, 1952, Serial No. 321,423

3 Claims. (Cl. 179—171)

This invention relates to electronic amplifiers and is a continuation-in-part of copending application Serial No. 773,849, filed September 13, 1947, now abandoned.

In electronic amplifiers it is conventional to provide a means for controlling the gain which operates substantially independently of the space current in the tubes of the amplifier. When operated at low amplification, therefore, an amplifier may consume about as much power as during operation at high amplification. Moreover, such a gain control means is often located at high impedance sections of the amplifier circuit so that troublesome characteristics such as extraneous noise pickup, unwanted positive or negative feedback and the like are prevalent.

In the case of battery powered amplifiers such for example as are used in hearing aid devices, it is particularly desirable to conserve the power as much as possible because of the cost and inconvenience of replacing batteries. Also, it is desirable to provide a suitably large signal to noise ratio so that the user may always distinguish a useful signal from background noise.

According to the present invention, therefore, the overall gain of a multistage electronic amplifier may be adjusted by means of a control circuit which simultaneously varies the amplification and the space current in at least some of the tubes of the amplifier. Preferably this is accomplished by interconnecting stages of the amplifier so as to provide degenerative feedback between at least two stages and so as to control simultaneously and in direct proportion the steady potentials on the electrodes of certain of the tubes. The variation of the steady potentials may be such that the power extracted from the power supply changes in amounts directly proportional to the gain so that power will be consumed only at a rate dictated by the amplification requirements of the user.

In a preferred arrangement for example, the volume control resistor may be connected as a rheostat in series between the source of plate potential and the plate electrode of a stage of the amplifier preceding the output stage. A grid electrode of a subsequent stage may also be connected to the potential source through the gain control resistor. The effect is to lower the electrode potentials and to introduce degenerative feedback in amounts which vary as a function of the amplification.

Further, the ratio between the useful signal and the background noise may be increased by reducing the gain by means of a suitable control network in a preceding amplifier stage so as to prevent overloading or saturation of a following output stage.

The invention may be better understood from the following detailed description of a representative embodiment, taken in conjunction with the accompanying single figure in the drawing.

In the following description, the invention will be considered, by way of example, as applied to an amplifier of the type used for hearing aids, although it is not limited to such use. Thus, in the single figure, a 3-stage resistance-capacity coupled hearing aid amplifier is shown, comprising the three amplifier tubes 10, 11 and 12, a source of plate supply 13 and a source of filament supply 14. The amplifier input is received from a conventional type hearing aid transmitter 15, one terminal of which is connected to the control grid 16 of the tube 10 and the other terminal of which is connected to ground at 17, as shown.

In order to enable the wearer of the hearing aid to control the tone as desired, a tone control switch 18 is provided which has a movable switch contact 19 and a plurality of fixed contacts 20, 21, 22 and 23. The fixed contact 20 is open and corresponds to the position of no tone control. The fixed contact 21 is connected to a condenser 24, the other terminal of which is connected by a conductor 25 to the plate electrode 26 of the tube 10. When the movable switch contact 19 is moved into engagement with the fixed contact 21, the condenser 24 is connected to the plate 26 of the tube 10 and to ground, thus filtering out some of the higher frequencies in the output of the microphone 15.

The fixed contact 22 is connected by a shielded conductor 27 to a resistor 28 which is connected to the control grid 16 of the tube 10. When the movable switch contact 19 is moved into engagement with the fixed contact 22, the resistor 28 is shunted across the microphone 15, changing its load and, therefore, changing the shape of its response characteristic in a desired manner.

The condenser 24 and the resistor 28 described above in the tone control circuit are conventional in the art and afford a certain amount of tone control in accordance with the desires of the wearer of the hearing aid. However, as indicated above, it has been found that when the hearing aid is worn in noisy surroundings, overloading of the output tubes 12 in the amplifier may cause the noise signal and the signal which the wearer desires to hear to appear as being of equal intensity although they may have different intensity levels at the microphone 15. As a result, the signal-to-noise ratio decreases and the improvement in hearing effected by the hearing aid is somewhat reduced.

The above described undesirable effect occurring when the hearing aid is used in noisy surroundings is overcome, in accordance with the invention, by connecting the fixed contact 23 on the tone control switch 18 to a resistor 29, the other terminal of which is connected to the plate 26 of the tube 10. When the movable switch contact 19 engages the fixed contact 23, the resistor 29 is connected to the plate 26 of the tube 10 and to ground, and its value is preferably chosen so as to effect a reduction in amplifier gain of substantially 11 db, although, obviously, the reduction in gain is not critical. In a typical amplifier, a loss in gain of approximately 11 db was effected by choosing a resistor 29 of approximately 300,000 ohms.

By reducing the gain in one of the initial stages of the amplifier, as indicated above, overloading of the output tube 12 is effectively prevented. As a result, the handling capacity of the hearing aid with respect to the amplitude of input signals is considerably extended.

The tube 11 is a tetrode including a cathode 30, a control grid 31, a screen grid 32 and a plate 33, and the output tube 12 is likewise a tetrode having a cathode 35, a control grid 36, a screen grid 37 and a plate 38. The tubes 11 and 12 are coupled by a resistance-capacitance network, the plate 33 of the tube 11 being connected through a coupling condenser 34 to the control grid 36 of the output tube 12. The plate 38 of the tube 12 is connected through the primary winding of an output transformer 39 to the source of plate supply 13.

The plate 33 of the tube 11 is connected through a fixed load resistor 40 to a slide tap 41' of a rheostat 41, comprising the gain control for the amplifier. The resistor 41'' of the rheostat 41 is connected at one end to the source of plate potential 13. The screen grid 32 of the tube 11 is connected through a fixed resistor 42 to the slide tap 41' of the rheostat 41, and a bypass condenser 43 is connected between the screen grid 32 and cathode 30. The screen grid 37 of the output tube 12 is connected directly to the slide tap 41' of the rheostat 41. Thus, it will be apparent that the steady D. C. voltages impressed on the screen grids 32 and 37 of the tubes 11 and 12, respectively, as well as on the plate 33 of the tube 11, may be controlled through the rheostat 41, with maximum potentials being applied when the latter is at its minimum resistance setting and minimum potentials being applied when at its maximum resistance setting.

Further, by virtue of the connections described, it will be apparent to those skilled in the art that, as the resistance inserted by the rheostat 41 is increased, an increase of degenerative feedback occurs in the tube 12. This is due to the relatively large component of signal current flowing in the rheostat 41 (assuming the rheostat to be adjusted to introduce a resistance value greater than zero) as a result of the connection to the screen grid electrode 37 of the tube 12. There results, therefore, a signal potential at the slide tap 41' of the rheostat which is 180° out of phase with the signal potential on the control grid 36 of the tube 12. Since the slide tap 41' is coupled to the control grid 36 through the circuit including resistor 40 and coupling condenser 34, a degenerative feedback loop is provided. This causes a reduction in its amplification as well as a reduction in distortion. Thus one control element in a low impedance portion of an amplifier circuit simultaneously controls both the amplification factor of the amplifier and the degenerative or negative feedback. It will also be apparent that a decrease in amplification by this method will result in a corresponding decrease in the power drawn from the plate supply source 13, whereas in more conventional circuits the plate supply source provides maximum power output at all times.

If it is desired to control the gain of the amplifier in the manner described above but without introducing degenerative feedback, a condenser 44 may be connected between the screen grid electrode 37 and the cathode electrode 35 of the tube 12. In this arrangement the condenser 44 by-passes the degenerative feed back signal to the cathode 35 of the tube 12. In this case the amplification and space current of the tubes 11 and 12 will be controlled by the volume control rheostat 41 solely due to the variation in steady electrode potentials on the grid electrode 32 and plate electrode 33 of the tube 11 and on the screen grid 37 of the tube 12. The condenser 44 will function to prevent any degenerative signal potentials from appearing on the control grid electrode 36 of the tube 12, thereby eliminating degenerative feedback.

While a representative embodiment has been described, the invention is not intended to be limited thereto but is susceptible of numerous changes in form and detail within the scope of the following claims.

I claim:

1. In an amplifier including at least two stages of amplification, each stage including an electronic tube having plate, control grid, and cathode electrodes, an adjustable resistor adapted to be connected to a source of tube energizing potential, said adjustable resistor including a slide tap, means to energize the tube of the first stage through a first circuit including the slide tap of the adjustable resistor, and in series therewith, a second resistor connected to said plate electrode, means coupling the plate electrode of the tube of the first stage to the control grid electrode of the tube of the second stage, the tube of the second stage including a screen grid electrode, and means to connect the screen grid electrode to said potential source including a second circuit connecting the screen grid electrode to the first circuit between said slide tap and said second resistor, the flow of screen grid current of the second tube through the slide tap and adjustable resistor to the source being 180° out of phase with the signal potential impressed on the control grid electrode of the tube of the second stage, thereby to introduce degenerative feedback into the amplifier which varies directly as a function of the magnitude of the resistance of the adjustable resistor, the tube energizing plate electrode potential of the tube of the first stage also being varied directly as a function of the magnitude of the resistance of said adjustable resistor, whereby the power consumption of the amplifier is directly proportional to the gain thereof.

2. An amplifier as set forth in claim 1, the tube of said first stage including a screen grid electrode, means including a resistor connecting the screen grid electrode of the tube of the first stage to said source through said slide tap and a capacitor connected between the screen grid and cathode electrodes of the tube of the first stage to prevent the appearance of the signal potential appearing across the adjustable resistor on the screen grid electrode of the tube of the first stage.

3. An amplifier as set forth in claim 1 including a capacitor connected between the screen grid and cathode electrodes of the second stage to bypass at least a portion of the signal potential impressed across the adjustable resistor due to the screen grid electrode current of the tube of the second stage.

References Cited in the file of this patent

UNITED STATES PATENTS

| | | |
|---|---|---|
| 1,950,144 | Hentschel | Mar. 6, 1934 |
| 1,987,976 | Roberts | Jan. 15, 1935 |
| 2,081,713 | Rohner | May 25, 1937 |
| 2,273,143 | Roberts | Feb. 17, 1942 |
| 2,342,822 | Rumpel | Feb. 29, 1944 |
| 2,345,761 | Lybarger | Apr. 4, 1944 |
| 2,392,415 | Soller | Jan. 8, 1946 |